(12) United States Patent
Hulsebos et al.

(10) Patent No.: US 8,208,140 B2
(45) Date of Patent: Jun. 26, 2012

(54) ALIGNMENT SYSTEM AND ALIGNMENT MARKS FOR USE THEREWITH

(75) Inventors: Edo Maria Hulsebos, 's-Hertogenbosch (NL); Franciscus Godefridus Casper Bijnen, Valkenswaard (NL); Patrick Warnaar, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 306 days.

(21) Appl. No.: 12/718,485

(22) Filed: Mar. 5, 2010

(65) Prior Publication Data

US 2010/0214550 A1 Aug. 26, 2010

Related U.S. Application Data

(63) Continuation-in-part of application No. 12/346,063, filed on Dec. 30, 2008.

(60) Provisional application No. 61/018,025, filed on Dec. 31, 2007.

(51) Int. Cl.
*G01B 11/00* (2006.01)

(52) U.S. Cl. ........ 356/400; 356/399; 356/401; 356/614; 356/620; 382/151; 250/548; 355/53; 355/55; 355/77

(58) Field of Classification Search .......... 356/399–401, 356/614, 615; 250/548; 382/151; 355/53, 355/55, 77
See application file for complete search history.

(56) References Cited

U.S. PATENT DOCUMENTS

| | | | |
|---|---|---|---|
| 5,418,613 A | 5/1995 | Matsutani | |
| 6,480,285 B1 * | 11/2002 | Hill | 356/492 |
| 6,628,406 B1 | 9/2003 | Kreuzer | |
| 7,002,667 B2 * | 2/2006 | Levasier et al. | 355/69 |
| 7,268,888 B2 * | 9/2007 | Hill | 356/500 |
| 7,289,226 B2 * | 10/2007 | Hill | 356/500 |
| 7,319,506 B2 | 1/2008 | Den Boef et al. | |
| 7,440,079 B2 | 10/2008 | Den Boef et al. | |
| 7,863,763 B2 | 1/2011 | Van Haren et al. | |
| 2006/0061743 A1 | 3/2006 | Den Boef et al. | |
| 2007/0114678 A1 * | 5/2007 | Van Haren et al. | 257/797 |
| 2009/0153825 A1 * | 6/2009 | Edart et al. | 355/67 |
| 2009/0176167 A1 | 7/2009 | Hulsebos et al. | |

FOREIGN PATENT DOCUMENTS

| | | |
|---|---|---|
| EP | 1 148 390 A2 | 10/2001 |
| EP | 0 906 590 B1 | 8/2003 |
| JP | 04-303916 A | 10/1992 |

(Continued)

OTHER PUBLICATIONS

Final Rejection mailed Dec. 14, 2011, directed to co-pending U.S. Appl. No. 12/346,063, filed Dec. 30, 2008, 18 pages.

(Continued)

*Primary Examiner* — Tarifur Chowdhury
*Assistant Examiner* — Isiaka Akanbi
(74) *Attorney, Agent, or Firm* — Sterne, Kessler, Goldstein & Fox P.L.L.C.

(57) ABSTRACT

A lithographic apparatus according to one embodiment of the invention includes an alignment system for aligning a substrate or a reticle. The alignment system includes a radiation source configured to illuminate an alignment mark on the substrate or on the reticle, the alignment mark comprising a maximum length sequence or a multi periodic coarse alignment mark. An alignment signal produced from the alignment mark is detected by a detection system. A processor determines an alignment position of the substrate or the reticle based on the alignment signal.

17 Claims, 13 Drawing Sheets

FOREIGN PATENT DOCUMENTS

| JP | 2001-358068 A | 12/2001 |
|---|---|---|
| JP | 2004-134474 A | 4/2004 |
| JP | 2006-114919 A | 4/2006 |
| JP | 2007-142419 A | 6/2007 |

OTHER PUBLICATIONS

English-Language translation of Notice of Reasons for Rejection directed to related Japanese Patent Application No. 2008-326729, mailed May 31, 2011, from the Japanese Patent Office; 4 pages.

English-Language Abstract for JP 04-303916 A, published Oct. 27, 1992; 1 page.

English-Language Abstract for JP 2001-358068 A, published Dec. 26, 2001; 1 page.

English-Language Abstract for JP 2004-134474 A, published Apr. 30, 2004; 1 page.

English-Language Abstract for JP 2006-114919 A, published Apr. 27, 2006; 1 page.

English-Language Abstract for JP 2007-142419 A, published Jun. 7, 2007; 1 page.

Non-Final Rejection mailed Aug. 1, 2011, directed to co-pending U.S. Appl. No. 12/346,063, filed Dec. 30, 2008; 12 pages.

Rife et al, "Transfer-Function Measurement with Maximum-Length Sequences", Journal of the Audio Engineering Society, vol. 37, No. 6, Jun. 1989, pp. 419-444.

"Maximum Length Sequence", Wikipedia, printed Jan. 15, 2009, http://en.wikipedia.org/wiki/N-sequence, 5 pgs.

\* cited by examiner

ALIGNMENT SYSTEM AND ALIGNMENT MARKS FOR USE THEREWITH

CROSS-REFERENCE TO RELATED APPLICATIONS

This application is a continuation-in-part of U.S. patent application Ser. No. 12/346,063 to Hulsebos et al., entitled "Alignment System and Alignment Marks for Use Therewith" and filed Dec. 30, 2008, which claims the benefit of U.S. Provisional Patent Appl. No. 61/018,025, filed Dec. 31, 2007, which is incorporated by reference herein in its entirety.

BACKGROUND

1. Field

Embodiments of the present invention relate to a lithographic apparatus, an alignment system, e.g. for use in a lithographic apparatus, and a method for manufacturing a device.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of one or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a typical manufacturing process using a lithographic projection apparatus, a pattern (e.g., in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The ever present demand in lithography to be able to image mask patterns with ever decreasing critical dimension (CD) necessitates increasing overlay accuracy (the accuracy with which two successive layers can be aligned with respect to each other). This drives a need for ever increasing alignment accuracy. Since the overlay error must be much smaller than the critical dimension and the alignment error is not the only contribution to overlay error, a critical dimension of 90 nm demands an alignment accuracy of 10 nm or less.

An important step in a typical lithographic process is aligning the substrate to the lithographic apparatus so that the image of the mask pattern is projected at the correct position on the substrate. Semiconductor, and other, devices manufactured by lithographic techniques may require multiple exposures to form multiple layers in the device, and it may be essential that these layers line up correctly. As ever smaller features are imaged, overlay requirements, and hence the accuracy required of the alignment process, become stricter.

In one known alignment system, described in EP-A-0 906 590, which document is hereby incorporated by reference in its entirety, marks on the substrate include two pairs of reference gratings, one X and one Y, with the two gratings of the pair having slightly different periods. The gratings are illuminated with spatially coherent light and the diffracted light is collected and imaged on a detector array, the different diffraction orders having been separated so that corresponding positive and negative orders interfere. Each detector in the array includes a reference grating and a photo detector. As the substrate is scanned, the output of the detector varies sinusoidally. When the signals from both gratings of a pair peak simultaneously, the mark is aligned. This type of system provides a large dynamic range and by using high diffraction orders, is relatively insensitive to mark asymmetry. However, the need to provide two gratings with different periods increases the amount of space required for the alignment marks on the substrate. It is desirable to minimize the amount of such "silicon real estate" devoted to alignment marks and therefore not available for production of devices, or for other purposes.

Another known alignment system, described in EP-A-1 148 390, which document is hereby incorporated by reference in its entirety, uses a compact self-referencing interferometer to generate two overlapping images rotated by +90° and −90° which are then made to interfere in a pupil plane. An optical system and (optional) spatial filter selects and separates the first order beams and re-images them on a detector. The system described in EP-A-1 148 390 utilizes a special technique, also described as self-referencing to determine the center of symmetry of an alignment mark. Also, this alignment system only uses the envelope of the detected signal to determine the correct alignment position.

The following descriptions are intended to be illustrative, not limiting. Thus, it will be apparent to one skilled in the art that modifications may be made to the invention as described without departing from the scope of the claims set out below.

SUMMARY

An embodiment of the present invention provides a method and an apparatus for aligning a reticle or a substrate that processes the raw alignment signal resulting from a DPCM mark by using a Hilbert transform to separate out the amplitude and phase components of the signals resulting from each periodicity of the DPCM mark. Analysis of the separate amplitude and phase components yields the alignment position of the reticle or substrate.

According to a further embodiment of the present invention, there is provided a method and an apparatus for aligning a reticle or a substrate that processes the raw alignment signal resulting from a DPCM mark by using phase advancement and phase retardation transformations to remove unwanted components of the raw alignment signal.

BRIEF DESCRIPTION OF THE DRAWINGS

Embodiments of the invention will now be described, by way of example only, with reference to the accompanying drawings, in which.

DETAILED DESCRIPTION

Figure 1:
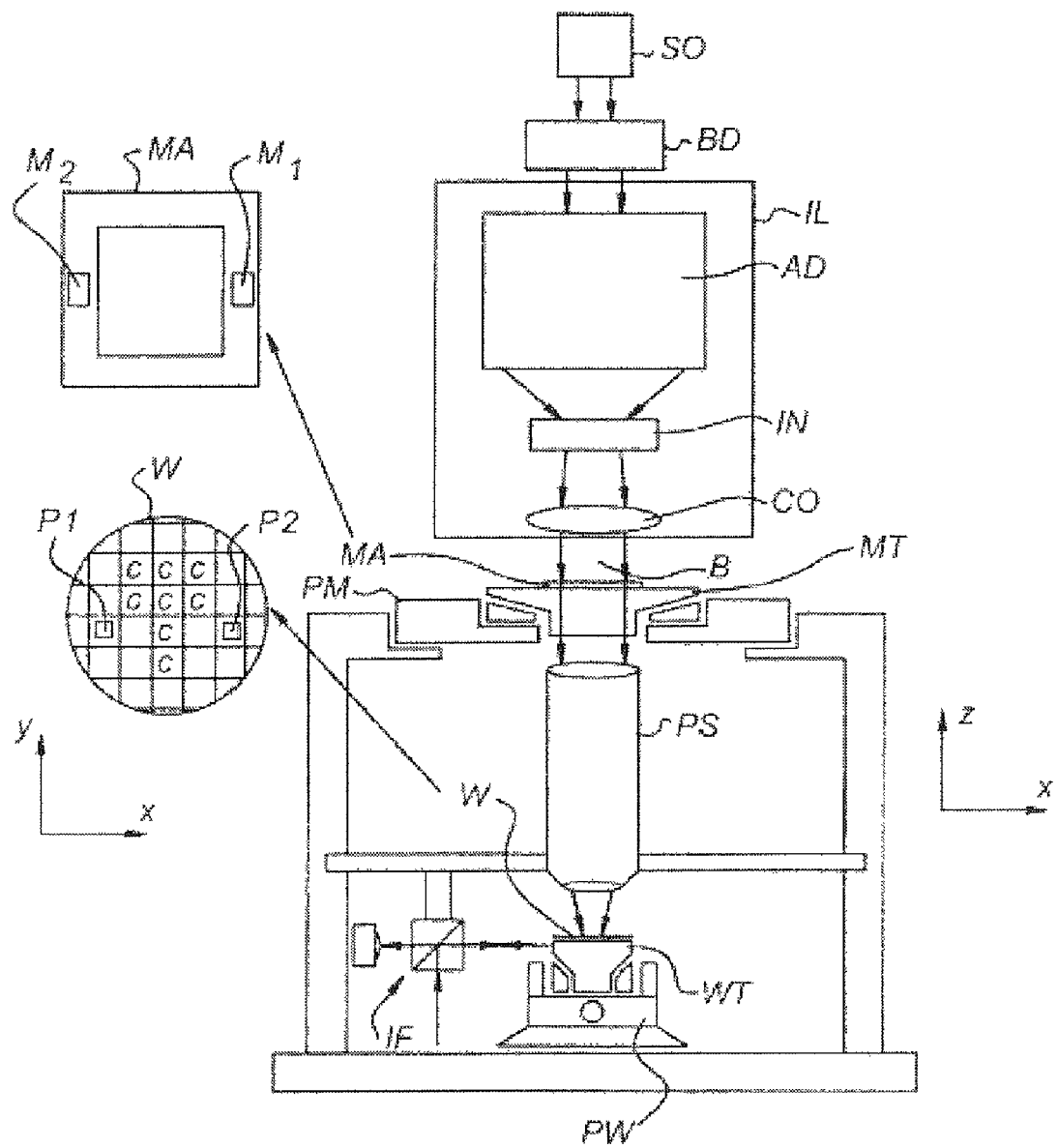
FIG. 1 shows a lithographic projection apparatus according to an embodiment of the invention.

FIG. 1 schematically depicts a lithographic apparatus according to one embodiment of the invention. The apparatus includes:

an illumination system (illuminator) IL configured to condition a radiation beam B (e.g. UV radiation or radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to radiation beam B by patterning device MA onto a target portion C (e.g., including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD for adjusting the angular intensity distribution of the radiation beam. Generally, at least the outer and/or inner radial extent (commonly referred to as sigma-outer and sigma-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of second positioner PW and position sensor IF (e.g., an interferometric device, linear encoder or capacitive sensor), substrate table WT can be moved accurately, e.g., so as to position different target portions C in the path of radiation beam B. Similarly, first positioner PM and another position sensor (which is not explicitly depicted in FIG. 1) can be used to accurately position mask MA with respect to the path of radiation beam B, e.g., after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks may occupy dedicated target portions, they may also be located in spaces between target portions (these are known as scribe-lane alignment marks). Similarly, in situations in which more than one die is provided on mask MA, the mask alignment marks may be located between the dies.

The depicted apparatus could be used in at least one of the following modes:

In step mode, mask table MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of the target portion C imaged in a single static exposure.

In scan mode, mask table MT and substrate table WT are scanned synchronously while a pattern imparted to the radiation beam is projected onto a target portion C (i.e. a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In applications including alignment of a wafer in a lithographic apparatus, an alignment mark according to an embodiment of the present invention can be used for coarse and/or fine wafer alignment. No additional gratings with a different periodicity are required for alignment purposes, resulting in less required real estate. Wafer alignment according to embodiments of the present invention can lead to a correct determination of alignment position without any ambiguity which is present in certain state of the art alignment systems. Throughput costs of operational use (e.g., time spent for alignment of wafers) are reduced, as no additional capture gratings or marks have to be scanned.

Embodiments of the present apparatus and method can be applied, for example, when the alignment system is an alignment system not using spatial filtering. As a result of not using spatial filtering techniques in the alignment, sharp images are possible from the alignment mark for further processing. An example of such an alignment system not using spatial filtering is described in patent application EP-A-1,148,390, which description is incorporated herein by reference in its entirety. The alignment system includes an alignment sensor that is self referencing to the center of symmetry of a mark having 180° of symmetry. The image of the alignment mark is divided into two images, which are then rotated 180° with respect to each other, and are then coherently recombined with an interferometer. With proper phasing of the interferometer paths, the recombined image will interfere constructively or destructively in amplitude. A prism may be used to form the two images, rotate the two images with respect to each other, and interferometrically recombine the two images.

A. Self Referencing Interferometers

Figure 2:
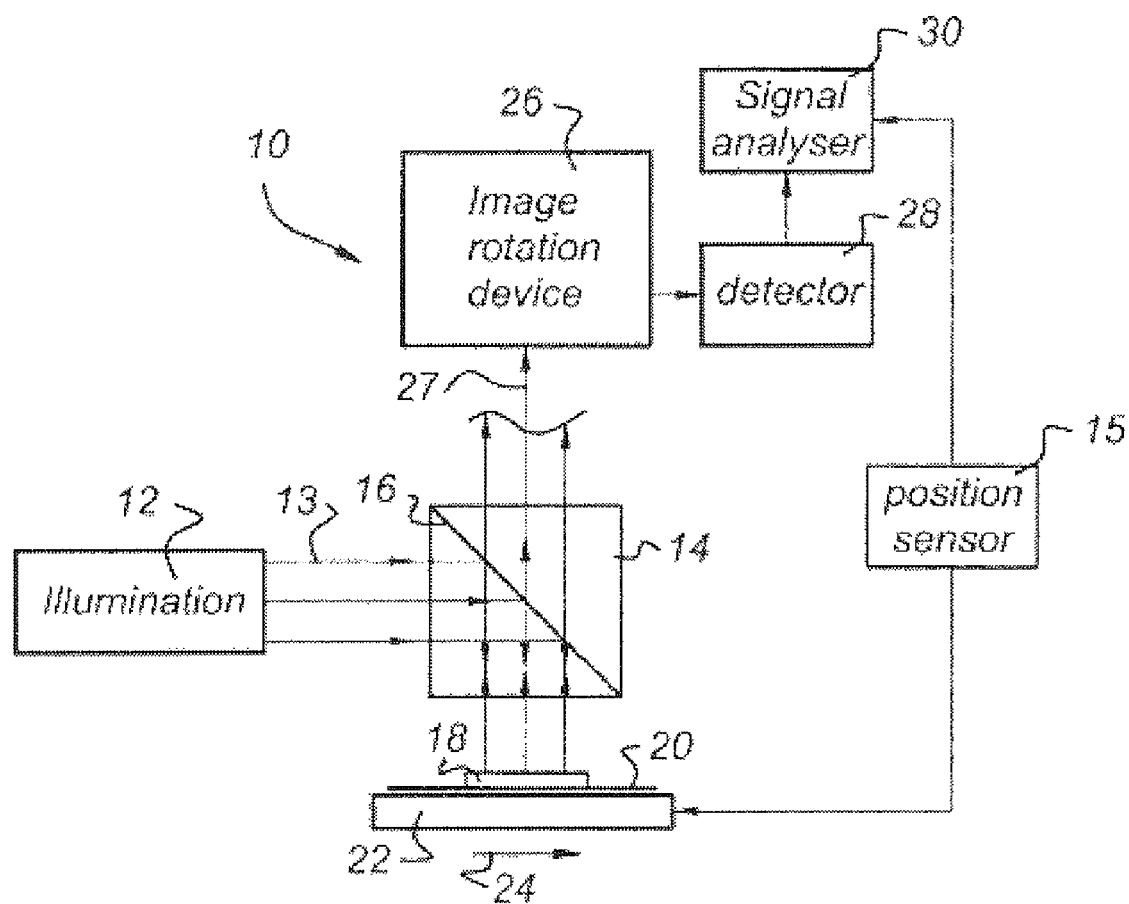
FIG. 2 shows a schematic view of an alignment system of the lithographic apparatus of FIG. 1.

In FIG. 2, a simplified schematic diagram is shown of an alignment system 10 as used in the lithographic apparatus according to one embodiment of the present invention. Alignment system 10 includes an illumination source 12, such as a laser, providing electromagnetic radiation 13, to a beam splitter 14. A portion of the electromagnetic radiation is reflected off coating 16 to illuminate an alignment mark or target 18. Alignment mark 18 is placed on or within a photosensitive substrate or wafer 20. Photosensitive substrate 20 is placed on a stage 22. Stage 22 may be scanned in the direction indicated by arrow 24. Electromagnetic radiation diffracted from alignment mark 18 passes through beam splitter 14 and is collected by image rotation device 26. It should be appreciated that a good quality image need not be formed, but that the features of alignment mark 18 should be resolved. Image rotation device 26 may be any appropriate set of optical elements, e.g., a combination of prisms, that forms two images of alignment mark 18, rotates one of the images with respect to the other by one hundred and eighty degrees, and then recombines the two images. The optical ray passing through the center of rotation established by image rotation device 26 defines sensor alignment axis 27. Detector 28 receives the electromagnetic radiation from image rotation device 26. Detector 28 then provides signals to signal analyzer 30. Signal analyzer 30 is coupled to stage 22 such that the position of the stage is known (e.g. using a position sensor 15) when the center of alignment mark 18 is determined. Therefore, the position of alignment mark 18 is accurately known with reference to stage 22. Accordingly, the location of the center of alignment mark 18 is known substantially exactly relative to a reference position. Additionally, the center of the mark may be very accurately determined even with a relatively poor image.

It is noted that the embodiment depicted uses a beam splitter 14 to direct the illuminating beam towards alignment mark 18, and to direct the image from mark 18 towards image rotation device 26. It will be apparent to the skilled person, that other (optical) arrangements may be used to obtain the same result of illuminating alignment mark 18 on wafer 20 and detecting an image of alignment mark 18.

An optical arrangement as shown in FIG. 2 is described in more detail with reference to a number of embodiments in the European patent application EP-A-1,148,390, which description is incorporated herein by reference in its entirety. This document describes embodiments of an alignment system with a coherent illumination source, interferometric combination of an image pair, and a detection system with detection based on interferometric properties.

Detection system or detector 28 may be based on intensity measurement of the combined image, e.g., a detector on which the combined image is projected. The combination of the rotated images can be regarded as a convolution measurement method, as the images of illuminated alignment mark 18 are overlaid on each other when alignment mark 18 moves with respect to illumination spot 7, as described with respect to FIG. 3 (see below). In conventional alignment systems, reference gratings are used on which a periodic alignment mark is imaged, after which only certain grating orders are used for detection. As no pupil filtering (or spatial filtering) is present in an alignment system 10 according to at least some embodiments of the present invention, all image information can be used. This has as a further advantage that a capturing method according to at least some embodiments of the present invention does not need any intermediate steps: both fine wafer alignment and coarse wafer alignment (when necessary) use the same kind of illumination and detection. No intermediate steps like order filtering when using gratings as alignment mark are necessary.

The dimension of illumination spot 7 is smaller than the length of alignment mark 18 in a scribe lane direction in an embodiment of the present invention. This provides sufficient signal data characteristics for an accurate and unambiguous alignment. However, it is also possible that illumination spot 7 is larger than the length of the alignment mark 18 in the scribe lane direction.

B. Types of Marks

A number of different alignment mark types may be used with alignment system 10, and a number of different types are described below.

1. Maximum Length Sequence Marks

Figure 3:
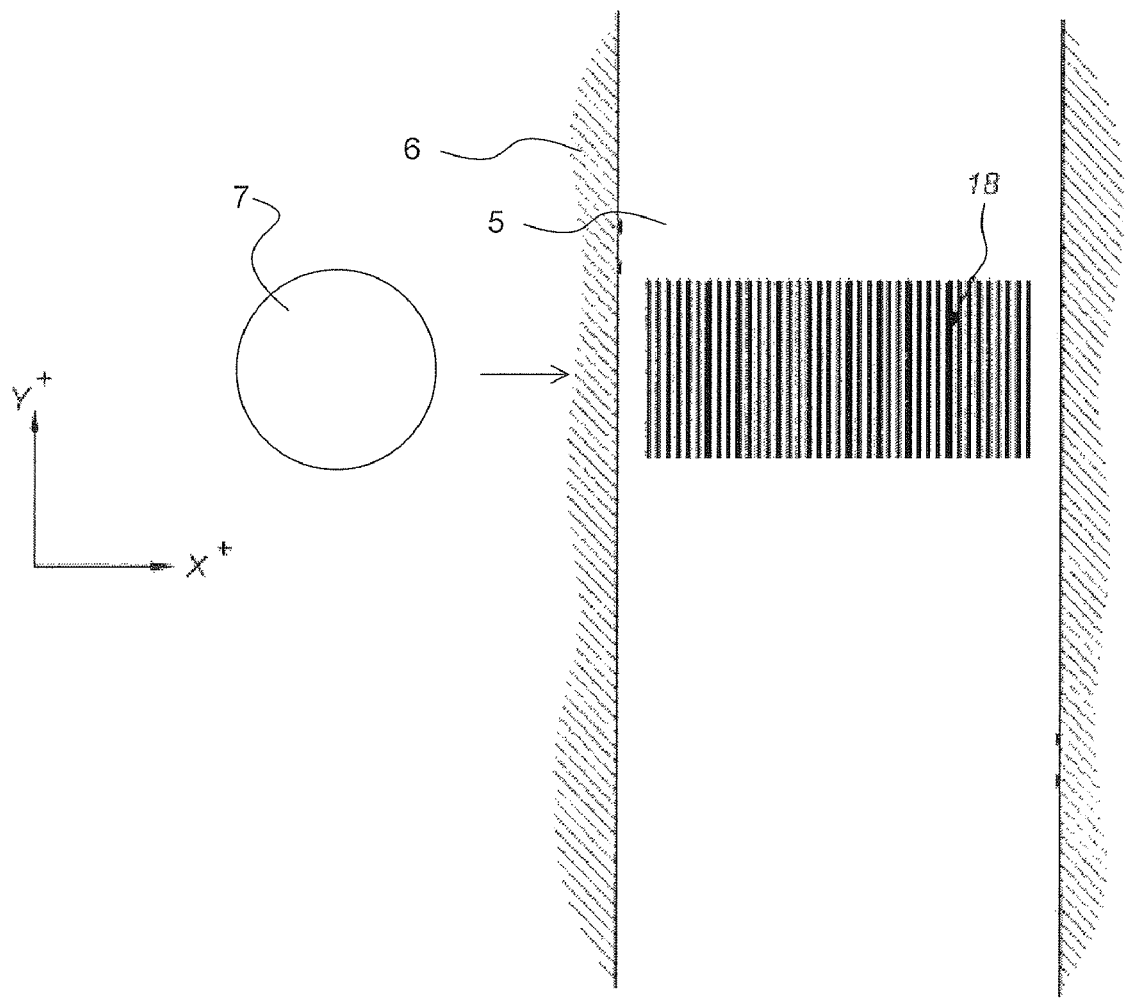
FIG. 3 shows a schematic view of an alignment mark according to an embodiment of the present invention.

In FIG. 3, a first embodiment of an alignment mark 18 is shown. Alignment mark 18 is positioned in a scribe lane 5 on a wafer 20 (of which die parts 6 are shown on both sides of the scribe lane 5). In FIG. 3, also the scribe lane direction X+, and the direction Y+ perpendicular to the scribe lane direction are indicated.

In a typical exemplary embodiment, the width of scribe lane 5 is about 40 µm. The length of alignment mark 18 is about 80 µm, and includes a large number of lines and spaces, e.g., with a pitch of about 1 µm. In general, alignment mark 18 has a length L and a plurality of N line/space pairs or mark elements with a pitch P. Thus, the number of line/space pairs N may also be determined by dividing the length L by the pitch P.

Alignment system 10 produces an illumination spot 7 on the wafer, and, due to the movement of wafer stage 22, alignment mark 18 will travel in the direction indicated by the arrow in FIG. 3 relative to illumination spot 7. Illumination spot 7 has a dimension which generally corresponds to the scribe lane width, but is smaller than the length of alignment mark 18. In other words, alignment mark 18 is longer than the dimension of illumination spot 7 in the scribe lane direction X+.

Figure 4:
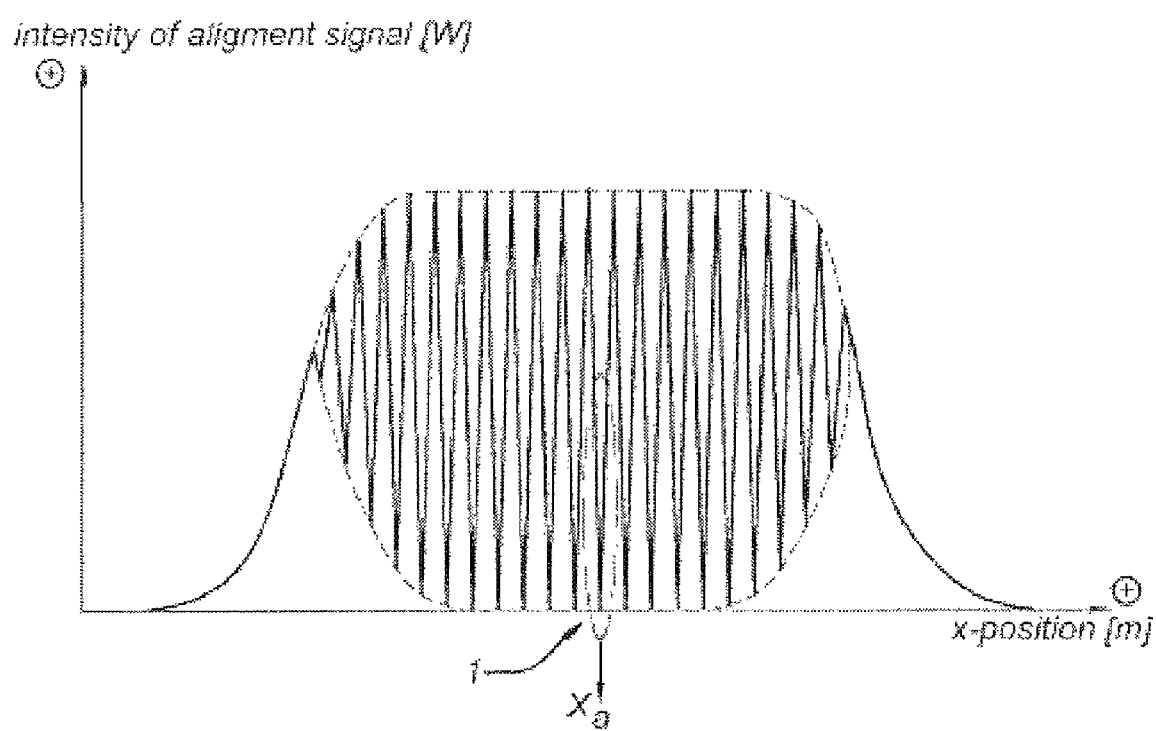
FIG. 4 shows a graph of a detected intensity signal versus position of the alignment system associated with the alignment mark shown in FIG. 3.

When alignment mark 18 moves under illumination spot 7 in scribe lane 5, detector 28 will provide an intensity signal as shown in FIG. 4. FIG. 4 shows an intensity signal value of detector 28 versus the position of wafer stage 22 in the X-direction. As image rotation device 26 and detector 28 operate as a convolution detector, the signal will vary from substantially zero when illumination spot 7 is not illuminating alignment mark 18 to a maximum intensity value when the lines and spaces of the two images are not aligned (i.e. the line of one image overlaps a space of the other image). When a line of one image overlaps a line of the other image, destructive interference will cause a decrease of the detected intensity signal. Due to the convolution type of signal detection, an alignment mark 18 having N line/space pairs will result in an intensity signal having 2N−1 minimum values. Depending on how many line/space pairs of the two formed images overlap, the intensity of the signal will be higher. A global maximum value is obtained when illumination spot 7 is entirely over alignment mark 18 (illumination spot 7 illuminates a maximum number of lines).

In an ideal embodiment, illumination spot 7 has straight leading and trailing edges in the scribe lane direction, which would result in illumination of an integer number of lines of alignment mark 18. However, in more practical embodiments, illumination spot 7 may be a rounded or even substantially round spot. When alignment mark 18 is 'hit' by illumination spot 7, this will result in the fact that initially, not the entire line(s) of alignment mark 18 will be illuminated. However, this will only result in the amplitude of the detected signal being somewhat lower. The further description below is valid for both the ideal embodiments and the practical embodiments of illumination spot 7.

Figure 5:
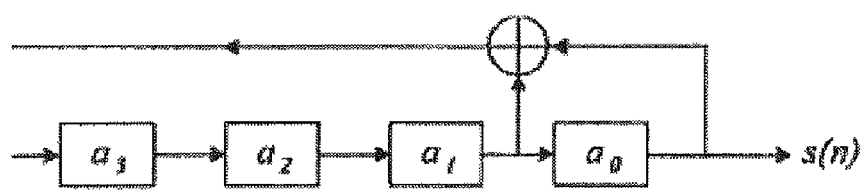
FIG. 5 shows a schematic view of a maximum length feedback register according to an embodiment of the present invention.

According to an embodiment of this invention shown in FIG. 5, there is provided a system for generating an alignment mark in accordance with one embodiment of the present invention. FIG. 5 shows an example of a system for generating the improved alignment mark sequence. Elements a0, a1, a2, and a3 can be feedback registers in which a subsequent value of an element (a0, a1, and a2) is the present value of the register element immediately to the left of the register element (a1, a2, and a3, respectively). For example, the next value of a0 would be the present value of a1. Furthermore, the subsequent value of an element a4 is the result of the mathematical operation a0 XOR a1.

In order to generate a sequence, the registers can be initialized to any value, except the zero vector (i.e., 0000). The generated sequence is pseudorandom and includes all of the reproducible states of the register elements (i.e., does not include the zero vector). The sequence repeats after all states have been generated. For example, if the register elements are initialized at time t0 to 1111 (m=4), the feedback registers will have 15 states (2m−1) and will produce the following sequence: t0=1111; t1=0111; t2=0011; t3=0001; t4=1000; t5=0100; t6=0010; t7=1001; t8=1100; t9=0110; t10=1011; t11=0101; t12=1010; t13=1101; t14=1110; and t15= 1111 . . . . The sequence, for example, can be an n-sequence or a maximal length sequence generated by maximal linear feedback shift registers. The above example should not be considered to be limiting as other maximum length sequences can be used. In addition, modifications to the maximum length sequence such as, for example, using only a portion of the maximum length sequence, may be made when the modification does not cause the alignment mark to have substantially different properties.

Figure 6:
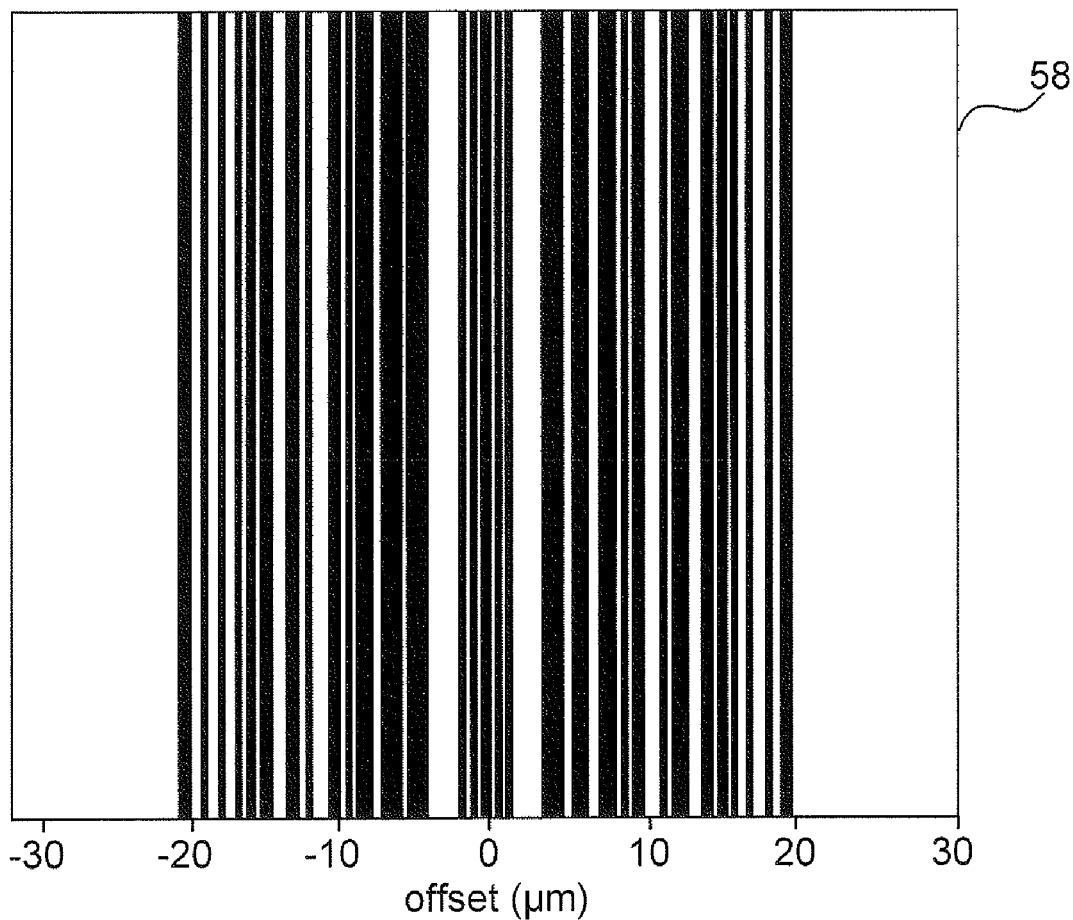
FIG. 6 shows a schematic view of a maximum length sequence alignment mark according to another embodiment of the present invention.

FIG. 6 shows an alignment mark 58 of an embodiment of the invention having a sequence of values, e.g. +1 and −1, which correspond to a sequence generated according to the principles of the system of FIG. 5. In an embodiment of the invention, alignment mark 58 is usable with existing self-referencing interferometers. Conventional self-referencing interferometers generate two images of a symmetric alignment mark, rotate the images 180° with respect to each other, and determine when the two images coincide with one another in order to determine the center of the alignment mark. Alignment mark 58 can be created having a maximum length sequence and symmetry suitable for use with self-referencing interferometers, for example.

In particular, according to an example of an embodiment shown in FIG. 6, alignment mark 58 can be created from a combination of two maximum length sequence components. For instance, in a first region from −20 μm to 0 μm, the alignment mark can correspond to a particular maximum length sequence. In addition, in a second region from 0 μm to 20 μm, the alignment mark can correspond to a mirrored copy of the maximum length sequence that has been reflected in order to reverse the sequence. Appending the original maximum length sequence to the mirrored copy of the maximum length sequence produces an alignment mark 58 that is symmetric, irregular, and non-periodic.

According to another embodiment (not shown), alignment mark 58 can be created from an original maximum length sequence and a mirrored copy of the maximum length sequence, as described above. Rather than appending the original maximum length sequence to the mirrored copy of the maximum length sequence, however, the original and the mirrored copy are interlaced. The length of alignment mark 58 can be increased by a variety of techniques such as, for example, increasing the length of the maximum length sequence or repeating alignment mark 58 by appending copies of alignment mark 58 to one another.

As can be seen in FIG. 6, alignment mark 58 is non-periodic, highly irregular, and symmetric about 0 μm. As a result of the non-periodic and irregular structure of alignment mark 58, cross talk caused by other wafer features is greatly reduced. In comparison, conventional alignment marks often have a high degree of periodicity and thus are more subject to cross talk caused by other wafer features which are often periodic.

Alignment mark 58 can produce an alignment signal having a substantially flat Fourier spectrum that does not tend to fluctuate randomly or decay with frequency, and that generally has relatively large magnitudes of high-order diffraction components. The magnitude of high-order diffraction components is important because they can be used to increase the accuracy of the determination of an alignment position which is calculated using the alignment signal. Alignment mark 58 has high-order diffraction components substantially as strong as the low-order diffraction components due to the spectral properties of the maximum length sequence. Thus, the energy of the alignment signal tends to be maximized because it contains more energy than any other signal for a given amplitude, it is not necessary to segment the alignment mark to enhance high-order components, and separate gratings, e.g., 8.0 and 8.8 μm, may not be required to increase the capture range.

Self-referencing alignment systems, for example, determine a degree of correlation between an original image and a mirrored image of an alignment mark to find the center of the alignment mark. The determination of a position of the alignment mark is not unique in general because periodic alignment marks, for example, can produce an alignment signal which repeats at different positions.

Alignment mark 58, however, produces a signal that can be used to determine a specific position from the symmetry of alignment mark 58. In particular, the autocorrelation function and the correlation function are the same between an original and a mirrored copy for symmetric signals. In addition, the autocorrelation function for alignment mark 58 results substantially in a band-limited Dirac delta function. As a result, alignment mark 58 will tend to produce a sharp change in the alignment signal when the alignment mark 58 has been centered.

Figure 7A:
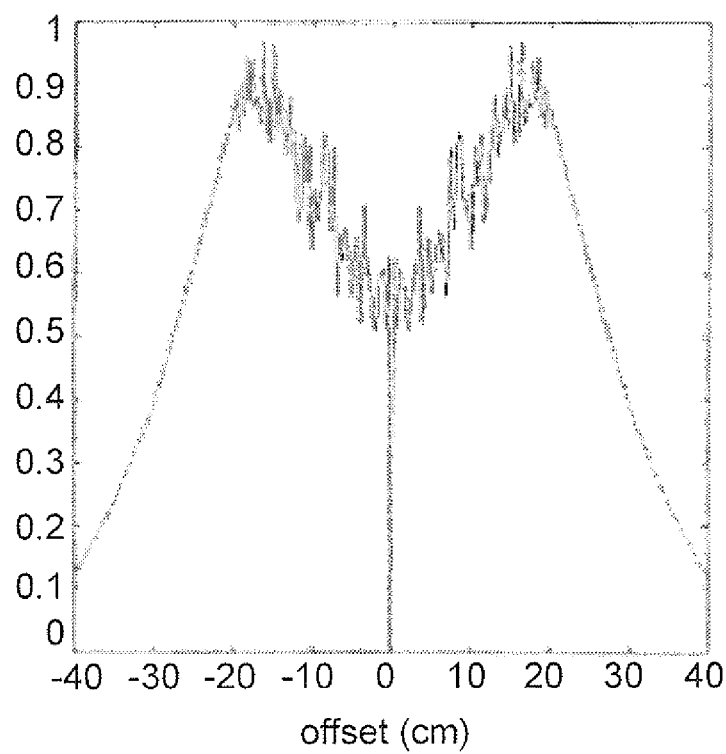
FIG. 7A shows a graph of a mathematical simulation of an intensity signal versus position of the alignment system associated with the alignment mark shown in FIG. 6.
Figure 7B:
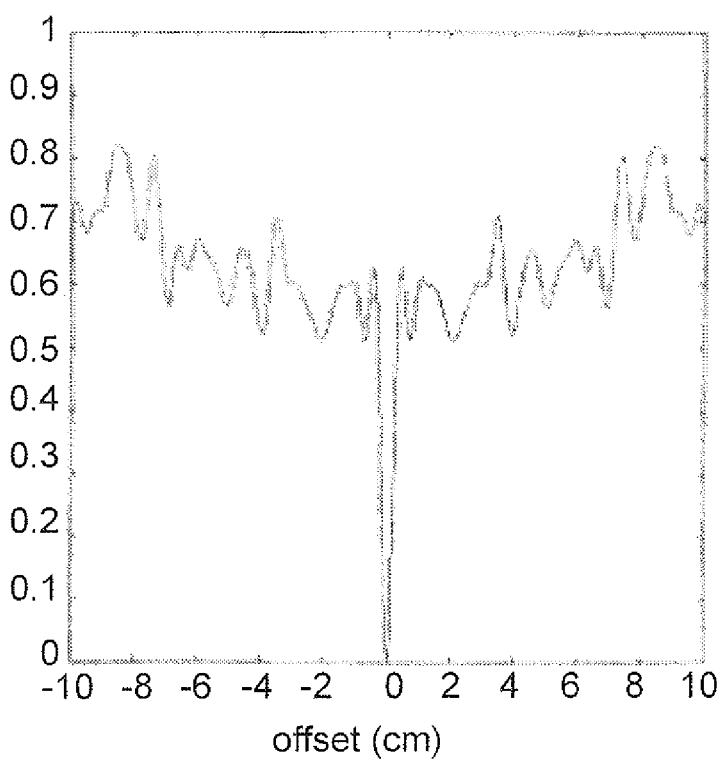
FIG. 7B shows the graph of FIG. 7A expanded about 0 offset.

FIGS. 7A and 7B show results for higher order intensities of a simulation of alignment mark 58. As can be seen, the intensity generally decreases or remains stable as the offset approaches 0 μm (e.g., in a first region from −20 μm to −1 μm, and in a second region from 1 μm to 20 μm). However, when alignment mark 58 is aligned in a narrow region around an offset of 0 μm (e.g., −1 μm to 1 μm), the intensity rapidly approaches 0. This feature of the alignment signal, for example, of alignment mark 58 can be used to uniquely determine the position of alignment mark 58.

Furthermore, the use of alignment mark 58 does not require making a compromise between capture resolution, contrast, and range as with the choice of a grating period for periodic marks, for example. Alignment mark 58 can be created having any level of detail and can be, e.g., equal to or larger than the resolution of the detector which detects the alignment signal. The level of detail of alignment mark 58 can be adapted to the wafer processing steps used to develop the wafer structures. As a result, the alignment mark 58 does not tend to be degraded by processing steps, e.g. chemical processing, that are optimized for structures having features sizes significantly different from alignment mark 58.

According to another aspect of the invention, a periodic alignment mark is provided. As discussed above, alignment marks typically produce an alignment signal which decreases rapidly for higher diffraction orders. It may be desirable to increase the signal magnitude of higher diffraction orders to increase the accuracy of the alignment position. Segmenting alignment marks, e.g. periodic marks (RM, PM, XPA, or SPM) or non-periodic marks (WxWy or GUM) can enhance the alignment signal by increasing the signal magnitude of a particular diffractive order. For example, the fifth diffraction order can be enhanced using a different pattern of segmentation than for enhancing the seventh diffraction order.

However, the signal magnitude of all of the diffraction orders can be made equally strong by patterning a conventional alignment mark using a maximum length sequence. In addition, even order diffractions can be used in this case.

Figure 11A:
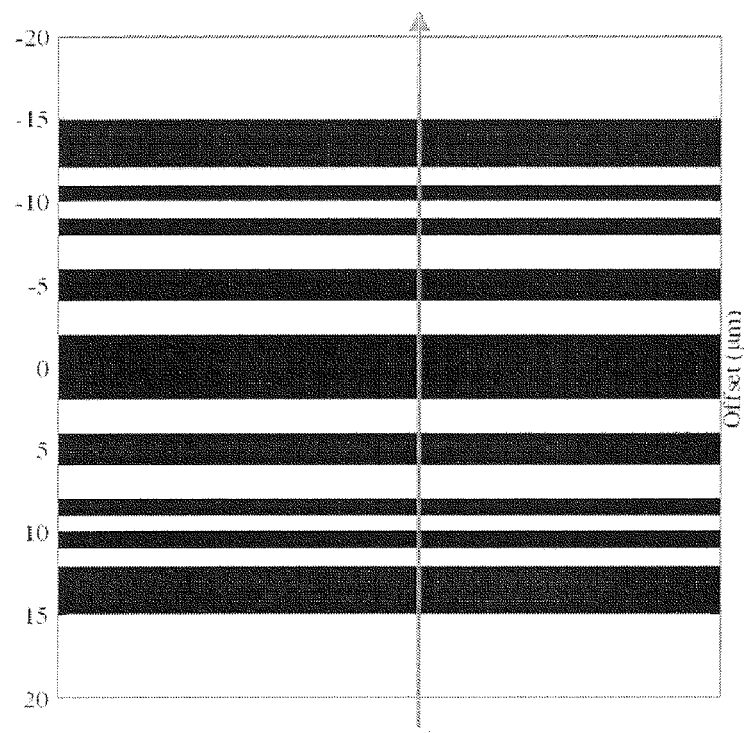
FIG. 11A shows a schematic view of an alignment mark according to an embodiment of the present invention.
Figure 11B:
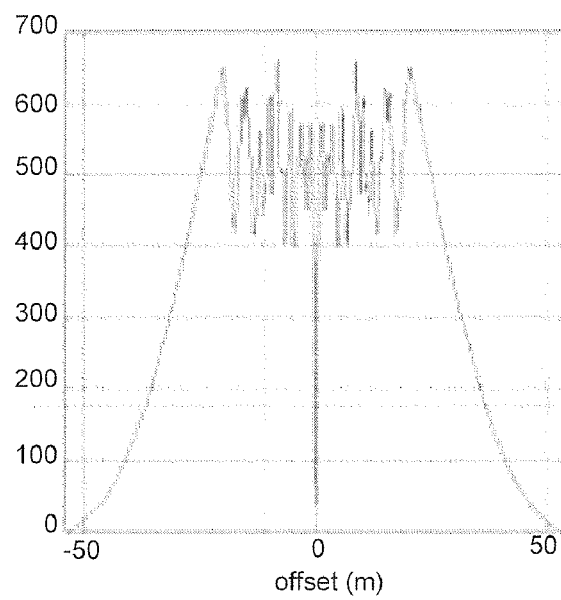
FIG. 11B shows a graph of a detected intensity signal versus position of the alignment system associated with the alignment mark shown in FIG. 11A.

As an alternative to MLS sequences, it is also possible to generate random sequences of +1 and −1 values, and construct a symmetric mark from this by adding a mirror copy of the sequence. Typically, a random sequence mark will not behave as well as an MLS mark. However, when a large number of sequences are generated, and the one with the alignment signal having the most distinctive dip is selected for use, a good alternative can be obtained. One advantage of a random sequence mark is that the sequence length may be chosen arbitrarily, while the MLS mark is limited to ($2^n-1$). An exemplary random sequence alignment mark is illustrated in FIG. 11A. FIG. 11B illustrates a graph of a detected intensity signal versus position of the alignment system associated with the random sequence alignment mark illustrated in FIG. 11A.

2. Multi Periodic Coarse Alignment Marks

Some alignment marks, such as the above-described MLS mark, can only be aligned using a template fit to a reference alignment signal, due to difficulties with subsegmentation. A second type of an alignment mark according to an embodiment of the present invention is a Multi Periodic Coarse Alignment Mark (MPCM). MPCMs may be used in both a self-referencing alignment system and a periodic alignment system. Systems using MPCMs may be aligned using a template fit, a sine fit, or a combination template/sine fit, as will be described further below.

According to an embodiment of the present invention, a MPCM contains periodic structures having at least two different periods or pitches, wherein the periodic structures are combined in a symmetric manner. Two exemplary marks, a Dual Periodic Coarse Alignment Mark (DPCM) and a Triple Periodic Coarse Alignment Mark (TPCM) are described below. These marks are discussed by way of example only and should not be considered as limiting.

a. Dual Periodic Coarse Alignment Mark (DPCM)

Figure 8A:
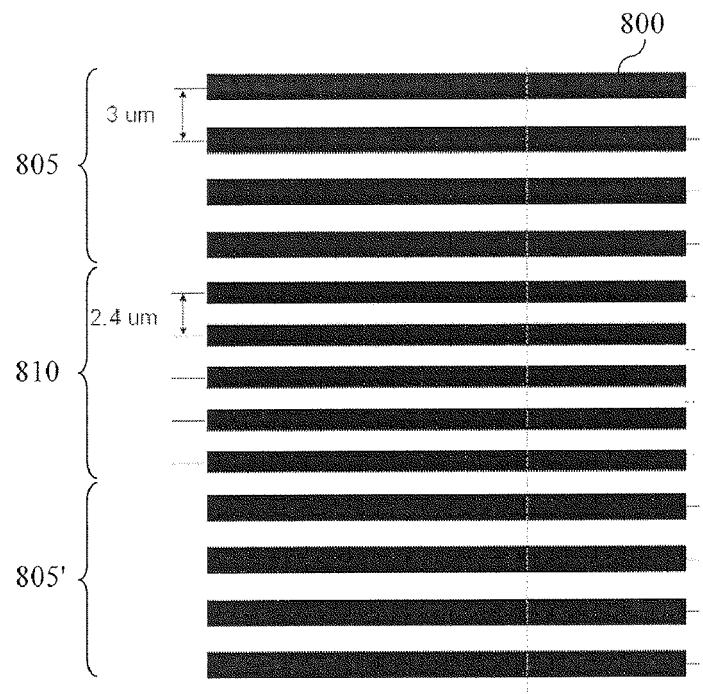
FIG. 8A shows a schematic view of an alignment mark according to an embodiment of the present invention.

FIG. 8A depicts an example of a Dual Periodic Coarse Alignment Mark (DPCM) 800. In a DPCM, a plurality of lines having a first pitch is inserted between two pluralities of lines having a second pitch that is different from the first pitch. Exemplary DPCM 800 includes a plurality of adjacent lines and spaces in three different sections of the exemplary mark. As can be seen in FIG. 8A, DPCM 800 is periodic and symmetric about a center line. Section 810 includes five lines having a first pitch P1. Section 810 is flanked by sections 805 and 805'. Each of sections 805 and 805' includes four lines having a second pitch P2 that is different from first pitch P1. In the example shown in FIG. 8A, first pitch P1 is approximately equal to 2.4 microns, while second pitch P2 is approximately equal to 3 microns. One of skill in the art will recognize that the actual pitches used in the alignment mark can be chosen based on a particular alignment need or system, and is not limited to the specific pitches or ratio of pitches described herein.

Figure 8B:
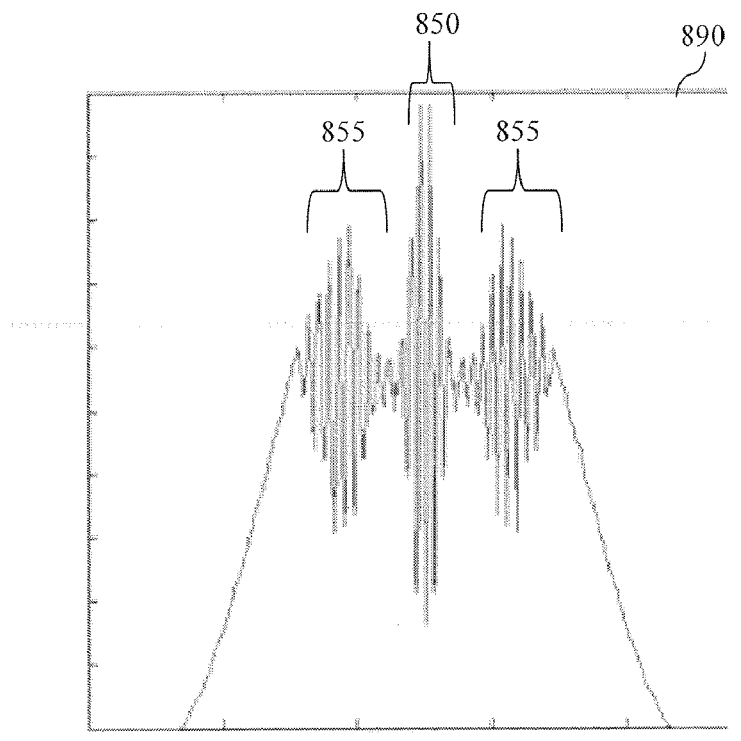
FIG. 8B shows a graph of a detected intensity signal versus position of the alignment system associated with the alignment mark shown in FIG. 8A.

FIG. 8B illustrates an alignment signal 890 resulting from a scan of exemplary DPCM 800. As DPCM 800 is aligned, the intensity of signal 890 increases to a maximum intensity. Sections 855 and 855' of signal 890 correspond to signatures from sections 805 and 805' of DPCM 800, respectively. Section 850 of signal 890 corresponds to a combination of signatures from sections 805, 810, and 805'. The signature from sections 805 and 805' (i.e., signal sections 855 and 855') can be separated from section 850 of signal 890 to provide a signature for section 810 of DPCM 800. The minimum (or extremum) intensity of the signal from section 810 of DPCM 800 represents an alignment position for DPCM 800.

In an embodiment, the alignment position of DPCM 800 is determined in a single scan of DPCM 800. In an embodiment, a sine fit is used to determine the alignment position of DPCM 800. In a sine fit, the signal produced by a periodic pattern on a device (e.g., a substrate, reticle, or other component) is compared to a sine function having the same periodicity as the periodic pattern. When the pattern signal substantially matches the sine function, the substrate is considered to be aligned. In this embodiment, the measured signature from DPCM 800 is fit to appropriate sine functions at regular intervals along the scanned mark. Comparison of the measured signal to the sine functions allows an approximate maximum for the signature from section 810 of DPCM 800 to be determined and provides an initial indication of alignment position. Such an initial indication may provide an alignment position within, for example, approximately 3 microns.

To align a MPCM such as DPCM 800 more accurately, a comparison between the signatures corresponding to a narrower portion of the alignment mark (which may still include signals from both periodic sections) may be used to determine a more accurate alignment position. The signature from sections 805 and 805' of DPCM 800 may be in phase with the signature from section 810 of DPCM 800, but with a slightly different frequency due to the differences between pitches P1 and P2. By determining this difference in frequency and using a Nonius-principle measurement, the phases of the two different periodic signatures produced by DPCM 800 may be aligned to provide a position having an accuracy within, for example, 100 nm.

Once DPCM 800 has been aligned based on the phases of the two periodic signatures, a sine fit based only on the signature for section 810 of DPCM 800 may be performed. Located at the center of DPCM 800, section 810 is the least affected by the surrounding product on the substrate, and thus has the lowest interference due to product noise (e.g., crosstalk). As a result, a sine fit performed on only this section provides a final alignment position.

In another embodiment, a template fit, in which the envelope of the measured signal is compared to a previously measured or simulated signal, is used to determine the alignment position. In a template fit, the signal detected from an alignment mark on a substrate is compared to a previously measured or simulated signal (i.e., the "template" signal). When the signal detected from the alignment mark corresponds most closely to the template signal, the substrate is considered to be aligned.

In a further embodiment, a template fit is used to determine an initial alignment position, while a sine fit is used to finalize the alignment position.

Figure 9:
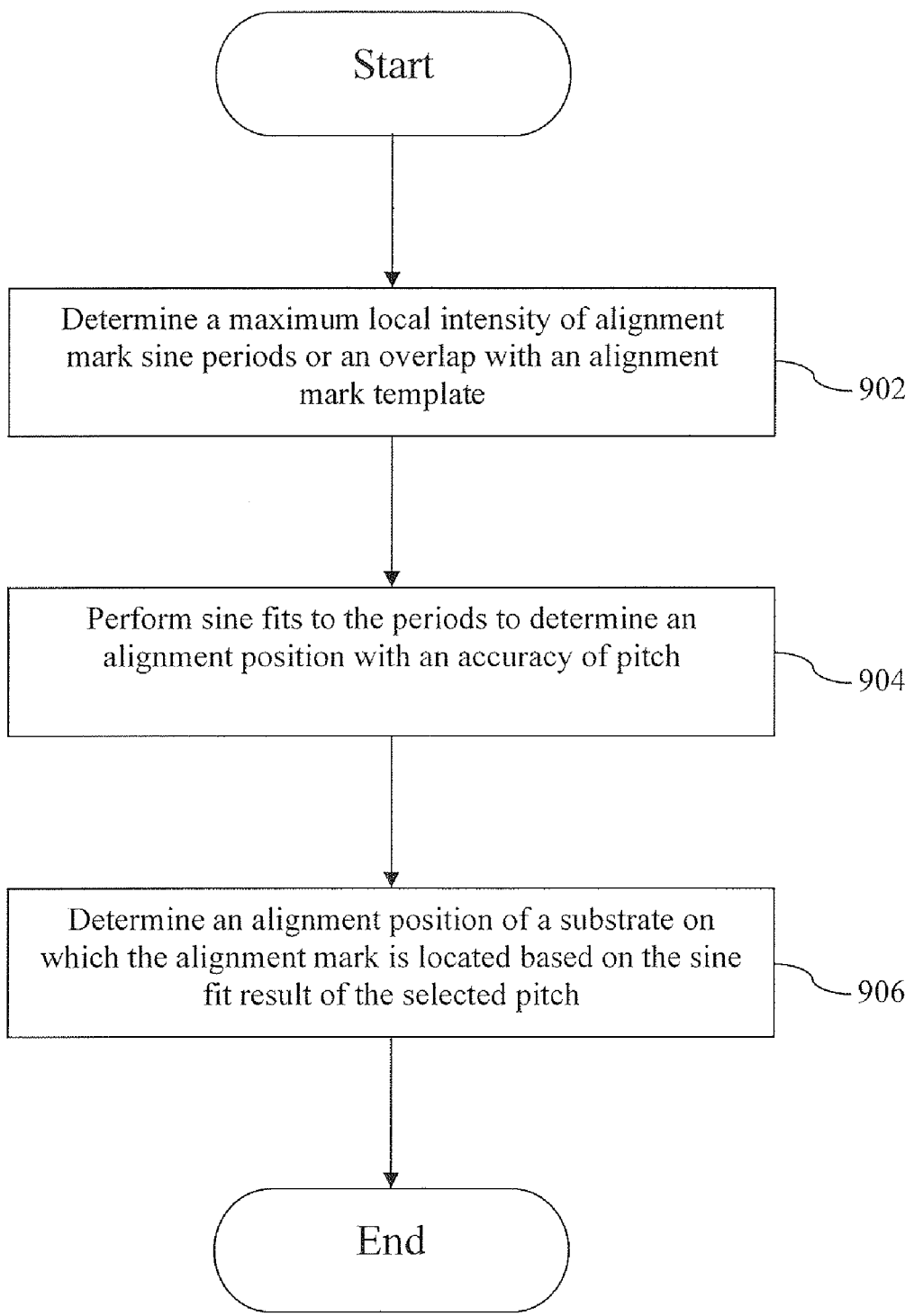
FIG. 9 is a flowchart of a method according to an embodiment of the present invention.

In accordance with the above, a method of using a DPCM located on a substrate to align the substrate according to an embodiment of the present invention is illustrated in FIG. 9. In step 902, a maximum local intensity of alignment mark sine periods or an overlap with an alignment mark template is determined, wherein a first portion of the alignment mark has a first periodicity and a second and third portion of the alignment mark have a second periodicity that is different from the first periodicity.

In step 904, sine fits to the periods are performed to determine an alignment position with an accuracy of pitch. The appropriate alignment position and pitch may be determined using, for example, the Nonius principle.

In step 906, an alignment position of a substrate on which the alignment mark is located is determined based on the sine fit result of the selected pitch.

It is an aspect of the DPCM that, with only two different periodic portions, a greater number of lines are available in each periodic portion compared to other MPCMs. This increased number of lines in each periodic portion may increase the accuracy of the alignment.

Figure 12:
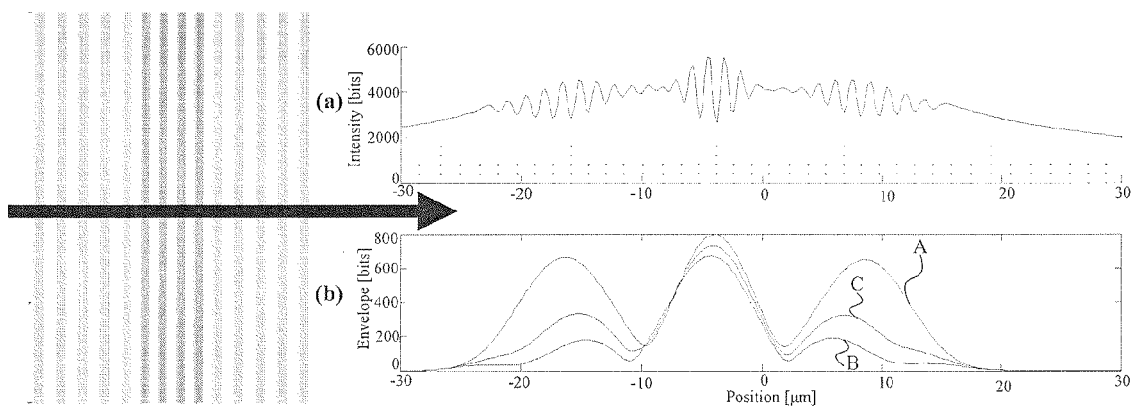
FIG. 12 illustrates a scan of a DPCM mark to output an alignment signal with the intensity and envelope of the alignment signal shown.

Further embodiments of the present invention improve the processing of the raw alignment signal provided by the DPCM mark and thereby provide superior alignment precision of the reticle or substrate. In a further embodiment of the invention, FIGS. 12(a) and 12(b) illustrate a scan of a DPCM mark to output an alignment signal with the intensity and envelope of two extracted signals shown. Curves A and B in FIG. 12(b) illustrate the extraction of the individual signals associated with each periodicity in the DPCM mark. Curve C in FIG. 12(b) illustrates a weighted combination of the values of the respective amplitudes of the individual signals associated with each periodicity. In this embodiment, the signal transform process includes a Hilbert transform and splits the raw alignment signal into two amplitude and two phase components, wherein each amplitude and phase component corresponds with one of the two periodicities within the DPCM mark. Next the zero phase transition point (i.e., zero crossing point) is determined for each of the phase components. Candidate positions for the alignment mark position are then selected based on the differences in the associated zero phase transition points of the respective periodicities. These candidate positions are identified using those zero crossing difference locations that represent local minima of the zero crossing difference function plotted versus location. The alignment position of the reticle or substrate is based on choosing the candidate position with the highest weighted combination of the signal amplitudes of the respective periodicities. In an embodiment, the weighted combination can be computed by forming the square root of the product of the individual signal amplitudes of the respective periodicities. Other embodiments can use alternative formulations of a weighted combination, such as a sum of absolute values.

Figure 13:
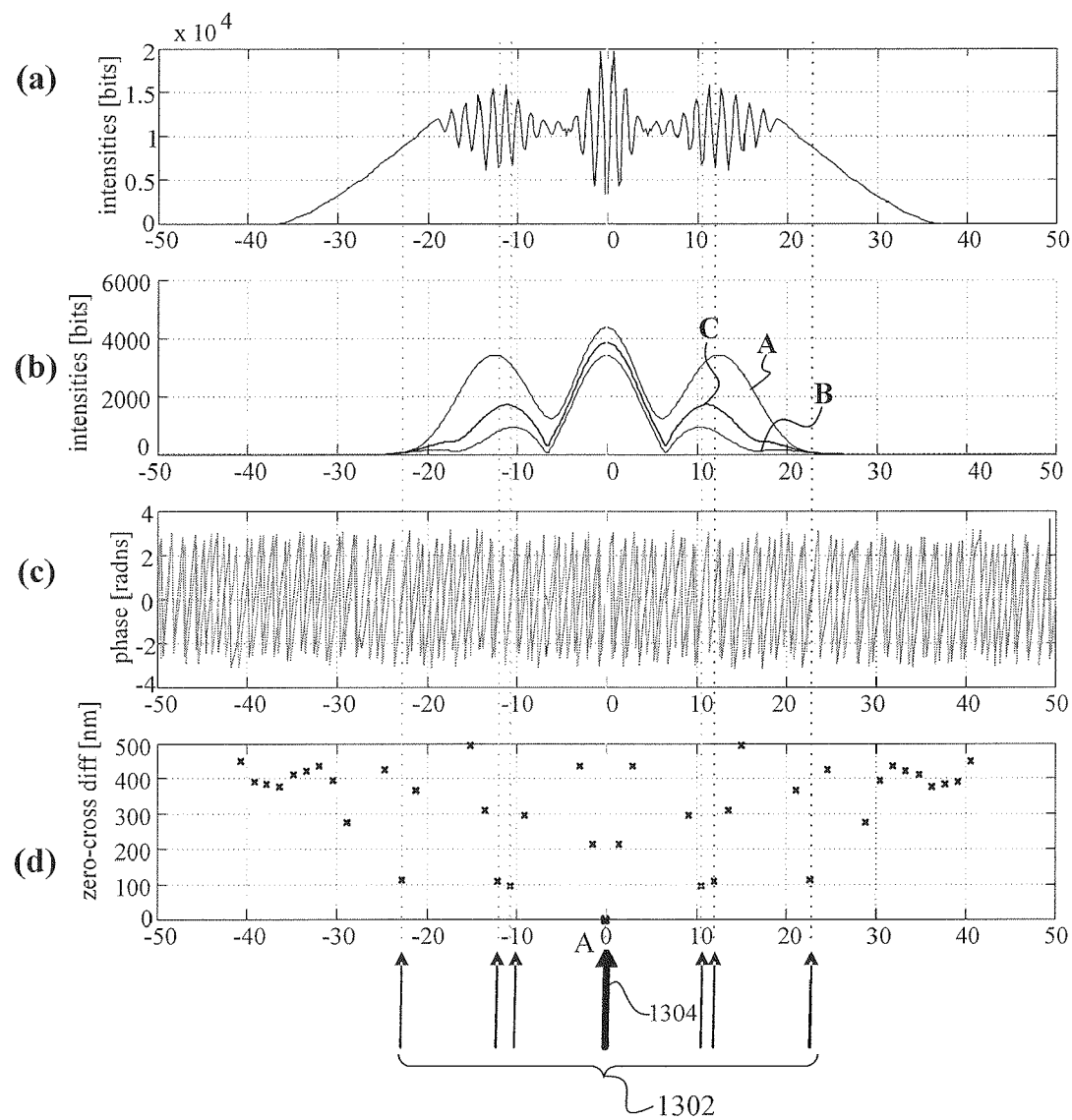
FIGS. 13(a) through 13(d) illustrate the Hilbert transform approach to alignment signal processing, according to an embodiment of the present invention.

FIG. 13(a) through 13(d) illustrate such alignment signal processing using the Hilbert transform approach. FIG. 13(a) illustrates the intensity of the raw alignment signal as a function of location. FIG. 13(b) illustrates the separation of the raw alignment signal into the two amplitude components (curves A and B) that reflect each of the two periodicities of the DPCM mark. FIG. 13(b) also illustrates the weighted combination (shown as curve C) of the two amplitude components as a function of position. FIG. 13(c) illustrates the separation of the raw alignment signal into the two phase components that reflect each of the two periodicities of the DPCM mark. Finally, FIG. 13(d) illustrates the zero crossing differences of the two phase components plotted as a function of position. FIG. 13(d) shows the candidate positions for the alignment mark position as vertical arrows 1302 based on the local minima of zero crossing differences across the position range of interest. The alignment position of the reticle or substrate is shown by the bold arrow 1304, and is chosen from vertical arrows 1302 based on the largest weighted combination of the individual amplitude signals (Curve C as shown in FIG. 13(b)).

The inventors have bound that the Hilbert transform embodiment is particularly robust in response to disturbances in processing and low alignment signal strength conditions. For example, this embodiment has shown robustness improvements when analyzing the alignment signal from the fine wafer alignment (FIWA) marks. In addition, the Hilbert transform embodiment may be more robust than more traditional fits used for alignment on periodic and wafer global alignment (WGA) marks. Moreover, the calculation time of the Hilbert transform embodiment is reduced in comparison to a method based purely on a sine fit.

In a still further embodiment of the present invention, a phase-advancement-phase-retardation approach to alignment signal processing is described. Semiconductor processing typically results in alignment marks providing signals with reduced contrast. As a result, it is a significant challenge to receive an alignment signal and determine the position of the mark. For example, in a coarse wafer alignment situation, the challenge is to scan for the alignment signal (e.g., by scanning the scribe lane of a substrate) and find the position of the mark to within an accuracy of approximately 100 nm. Similarly, in a fine wafer alignment example, the challenge is to scan over a fine wafer alignment mark (typically a uniform grid) and find the position of the mark to within an accuracy of approximately 1 nm. Alignment to low contrast layers can be severely hampered by the poor sensitivity in detecting relatively weak alignment signals.

Figure 14:
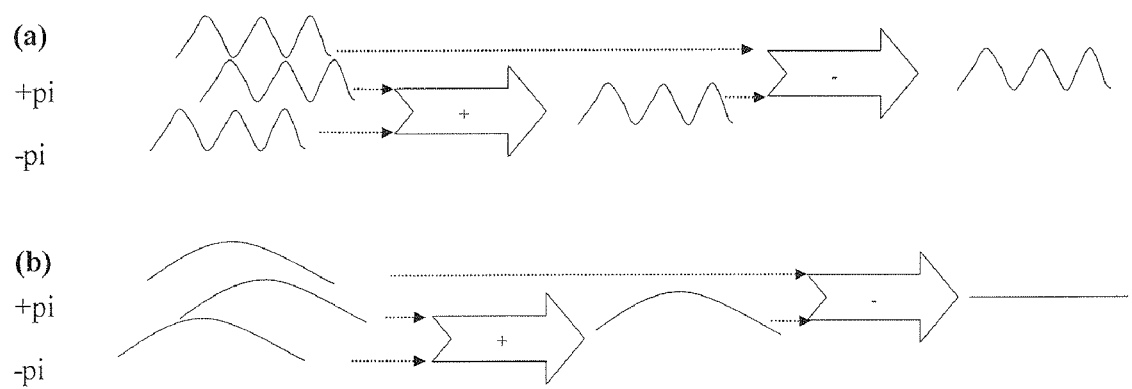
FIG. 14 illustrates the concept of the phase-advancement-phase-retardation approach to alignment signal processing, according to an embodiment of the present invention.

FIG. 14 illustrates a phase-advancement-phase-retardation approach to alignment signal processing, according to an embodiment of the present invention. This embodiment transforms the raw alignment signal using a phase shift of pi radians. Specifically, the raw alignment signal is mathematically adjusted based on combining the raw alignment signal with two versions of the same raw alignment signal, but with one version retarded by half a period (or pi radians) and the other version advanced by half a period. Mathematically, the transform is as follows:

$$\text{Inten}(x)=0.5*\text{Inten}(x)-0.25*\{\text{Inten}(x-0.5*\text{Period})+\text{Inten}(x+0.5*\text{Period})\}$$

where Inten(x) is intensity as a function of position and period is a period associated with the intensity signal. Phase advancements and retardations using amounts other than pi radians (e.g., 2*pi radians) can be used, although pi radians has been found to provide robust results in many signal conditions.

Still referring to FIG. 14, the upper portion of the figure (FIG. 14(a)) illustrates the impact of the transformation on a periodic signal, in which the periodic signal is preserved. However, an undesired relatively constant (or low frequency) background signal (as shown in FIG. 14(b)) is significantly reduced, and thereby enhancing the sensitivity of detecting the alignment signal. For example for the DPCM 800, for periods below the detection period of 1.2 μm, the calculated noise reduction factor for high frequency unwanted signals can be shown to be sqrt((0.5)^2+2*(0.25)^2)=0.61.

As noted above, the phase-advancement-phase-retardation approach readily removes unwanted components of the signal, thereby improving the sensitivity of the alignment signal detection. It should be noted that phase-advancement-phase-retardation approach to background signal reduction can be used by itself or in conjunction with other embodiments.

b. Triple Periodic Coarse Alignment Mark (TPCM)

Figure 10A:
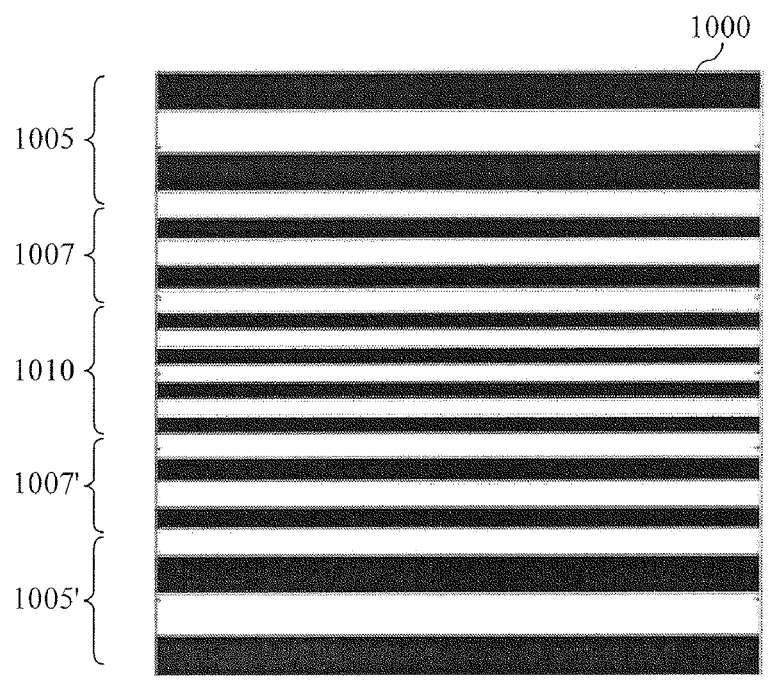
FIG. 10A shows a schematic view of an alignment mark according to an embodiment of the present invention.

FIG. 10A depicts an example of a Triple Periodic Coarse Alignment Mark (TPCM) 1000. In a TPCM, a plurality of lines having a first pitch is inserted between two pluralities of lines having a second pitch that is different from the first pitch. The resulting set of lines is in turn inserted between two pluralities of lines having a third pitch that is different from both the first and second pitches. Exemplary TPCM 1000 contains a plurality of adjacent lines and spaces in five different sections. Section 1010 includes four lines having a first pitch TP1. Section 1010 is flanked by sections 1007 and 1007'. Each of sections 1007 and 1007' includes two lines having a second pitch TP2 that is different from first pitch TP1. The combination of sections 1007, 1010, and 1007' is flanked by sections 1005 and 1005'. Each of sections 1005 and 1005' includes two lines having a third pitch TP3 that is different from both first pitch TP1 and second pitch TP2. One of skill in the art will recognize that the actual pitches used in the alignment mark can be chosen based on a particular alignment need or system, and is not limited to any specific pitches or ratio of pitches described herein.

Figure 10B:
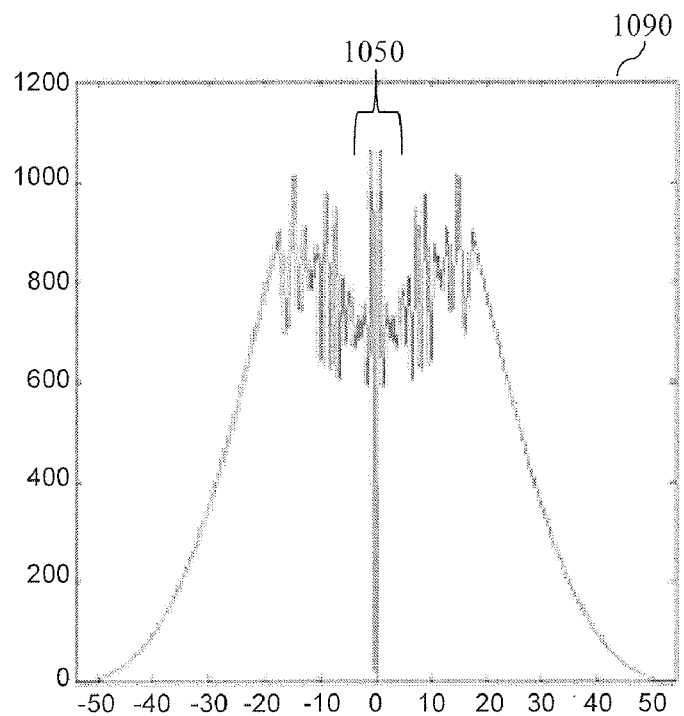
FIG. 10B shows a graph of a detected intensity signal versus position of the alignment system associated with the alignment mark shown in FIG. 10A.

FIG. 10B illustrates an alignment signal 1090 resulting from a scan of exemplary TPCM 1000. As with the alignment signal for an MLS mark (see FIG. 6), the intensity of alignment signal 1090 from TPCM 1000 generally decreases or remains stable as the offset approaches 0 μm (e.g., in a first region from −20 μm to −1 μm, and in a second region from 1 μm to 20 μm). However, for a narrow region around an offset of 0 μm (e.g., −1 μm to 1 μm), the intensity of alignment signal 1090 rapidly approaches 0. As a result, TPCM 1000 will tend to produce a sharp change in the alignment signal when TPCM 1000 has been centered. This feature of the alignment signal can be used to determine the position of TPCM 1000 with high accuracy. To fit alignment signal 1090, a measurement and alignment method similar to that described with respect to DPCM 800 may be used, with an analysis of three sine functions instead of just two. Additionally, a template fit or a combination template/sine fit may be used to align TPCM 1000. In an embodiment, the alignment position of TPCM 1000 is determined in a single scan of TPCM 1000.

TPCM 1000 offers an advantage over DPCM 800 in that TPCM 1000 is more robust against cross-talk with a signal from a product on the same substrate as TPCM 1000. Alignment marks, such as DPCM 800 and TPCM 1000, may be placed in the scribelanes of a substrate, such that they are close to one or more patterned products included on the substrate. During the scan of an alignment mark, signals from a feature on a product pattern may interfere with the alignment mark signal, especially if the product signal has a similar periodicity to the alignment mark signal. This cross-talk may lessen the accuracy of an alignment measurement, or may make an accurate alignment measurement impossible. As described with respect to DPCM 800, only two periodic elements are needed to perform, for example, a sine fit. TPCM 1000 has an additional periodic element; if one of the periodic elements of TPCM 1000 is unavailable due to cross-talk by the substrate product, two periodic elements are still available to complete the analysis. Accordingly, TPCM 1000 may be aligned based on a fit of two periodic signatures or all three periodic signatures if there is no cross-talk. It is noted that since the number of lines included in each periodic element are fewer in TPCM 1000 than in DPCM 800, the alignment position measured using TPCM 1000 may be less accurate than an alignment position measured using DPCM 800.

Other MPCMs having a different number of periodic sections are also contemplated by the present invention, with the periodic sections arranged symmetrically about a central line.

In an embodiment, MPCMs, such as DPCM 800 and TPCM 1000, may be used to align legacy detector systems. For example, MPCMs may be used to align legacy detector systems that require use of periodic alignment marks. When creating an MPCM mark for aligning such a legacy detection system, the dimensions, including the pitches or periods, of the MPCM mark may be selected to correspond with the particular legacy system. Alternatively, the MPCM mark may be used in a self-referencing alignment system. For each type of alignment system, it is generally possible to align the MPCM marks in a single scan.

In an embodiment, determining which type of MPCM to use may depend on the product or the application. For example, determining the periodicities or pitches to use for each portion of the respective MPCM may depend on pattern pitches or other dimensions used in the product or application.

The alignment marks and alignment methods described above are only examples and are not meant to be limiting. For example, in the examples described above, the center pitch was used for fine alignment. This is not meant to be limiting and any of the pitches or portions of the alignment signatures may be used for alignment.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The teens "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

What is claimed is:

1. A method for aligning a substrate or reticle, comprising:
   receiving a raw alignment signal produced by illumination of an alignment mark on the substrate or reticle, wherein a first portion of the alignment mark has a first periodicity and a second portion of the alignment mark has a second periodicity that is different from the first periodicity;
   performing a transformation of the raw alignment signal based at least in part on a Hilbert transform to form a first signal having a first amplitude and a first phase, and a second signal having a second amplitude and a second phase, wherein the first signal and the second signal are associated with the first periodicity and the second periodicity respectively;
   selecting candidate alignment positions based on local minima in a difference between zero crossings of the first phase of the first signal and zero crossings of the second phase of the second signal;
   determining an alignment position of the substrate or reticle based on the selected candidate alignment position having a highest weighted combination of the first amplitude and the second amplitude; and
   aligning the substrate or reticle based on the determined alignment position.

2. The method of claim 1, wherein the weighted combination is formed by taking the square root of the product of the first amplitude and the second amplitude.

3. The method of claim 1, further comprising:
   prior to performing a transformation, performing a background signal removal transformation on the raw alignment signal.

4. The method of claim 3, wherein the performing a background signal removal transformation includes combining the raw alignment signal with derived versions of the raw alignment signal that include a phase advanced version of the raw alignment signal and a phase retarded version of the raw alignment signal.

5. The method of claim 4, wherein the phase-advanced version includes an advancement of pi radians and the phase-retarded version includes a retardation of pi radians.

6. An alignment system for aligning a substrate or a reticle comprising:
   a radiation source configured to illuminate during use an alignment mark on the substrate or on the reticle, wherein a first portion of the alignment mark has a first periodicity and a second portion of the alignment mark has a second periodicity that is different from the first periodicity;
   a detection system configured to detect a raw alignment signal produced from the alignment mark; and
   a processor configured to determine an alignment position from the raw alignment signal by:
   performing a transformation of the raw alignment signal based at least in part on a Hilbert transform to form a first signal having a first amplitude and a first phase, and a second signal having a second amplitude and a second phase, wherein the first signal and the second signal are associated with the first periodicity and the second periodicity respectively;
   selecting candidate alignment positions based on local minima in a difference between zero crossings of the first phase of the first signal and zero crossings of the second phase of the second signal;
   determining an alignment position of the substrate or reticle based on the selected candidate alignment position having a highest weighted combination of the first amplitude and the second amplitude; and
   aligning the substrate or reticle based on the determined alignment position.

7. The alignment system of claim 6, wherein the weighted combination is formed by taking the square root of the product of the first amplitude and the second amplitude.

8. The alignment system of claim 6, wherein the processor is further configured to:
   prior to performing a transformation, perform a background signal removal transformation on the raw alignment signal.

9. The alignment system of claim 8, wherein the performing a background signal removal transformation includes combining the raw alignment signal with derived versions of the raw alignment signal that include a phase advanced version of the raw alignment signal and a phase retarded version of the raw alignment signal.

10. The alignment system of claim 9, wherein the phase-advanced version includes an advancement of pi radians and the phase-retarded version includes a retardation of pi radians.

11. A lithographic projection apparatus, comprising:
    an illumination system configured to condition a radiation beam;
    a support constructed to support a patterning device, the patterning device being capable of imparting the radiation beam with a pattern in its cross-section to form a patterning radiation beam;
    a substrate table constructed to hold a substrate;
    a projection system configured to project the patterned radiation beam onto a target portion of the substrate;
    a radiation source configured to illuminate an alignment mark on the substrate or on the patterning device, wherein a first portion of the alignment mark has a first periodicity and a second portion of the alignment mark has a second periodicity that is different from the first periodicity;
    a detection system configured to detect a raw alignment signal produced from the alignment mark; and
    a processor configured to determine an alignment position from the raw alignment signal by:
    performing a transformation of the raw alignment signal based at least in part on a Hilbert transform to form a first signal having a first amplitude and a first phase, and a second signal having a second amplitude and a second phase, wherein the first signal and the second signal are associated with the first periodicity and the second periodicity respectively;
    selecting candidate alignment positions based on local minima in a difference between zero crossings of the first phase of the first signal and zero crossings of the second phase of the second signal;
    determining an alignment position of the substrate or reticle based on the selected candidate alignment position having a highest weighted combination of the first amplitude and the second amplitude; and aligning the substrate or reticle based on the determined alignment position.

12. The lithographic projection apparatus of claim 11, wherein the weighted combination is formed by taking the square root of the product of the first amplitude and the second amplitude.

13. The lithographic projection apparatus of claim 11, wherein the processor is further configured to:
  prior to performing a transformation, perform a background signal removal transformation on the raw alignment signal.

14. The lithographic projection apparatus of claim 11, wherein the performing a background signal removal transformation includes combining the raw alignment signal with derived versions of the raw alignment signal that include a phase advanced version of the raw alignment signal and a phase retarded version of the raw alignment signal.

15. The lithographic projection apparatus of claim 14, wherein the phase-advanced version includes an advancement of pi radians and the phase-retarded version includes a retardation of pi radians.

16. A method for aligning a substrate or reticle, comprising:
  receiving a raw alignment signal produced by illumination of an alignment mark on the substrate or reticle, wherein a first portion of the alignment mark has a first periodicity and a second portion of the alignment mark has a second periodicity that is different from the first periodicity; and
  performing a background signal removal transformation on the raw alignment signal to form an output alignment signal, wherein the performing a background signal removal transformation includes combining the raw alignment signal with derived versions of the raw alignment signal that include a phase advanced version of the raw alignment signal and a phase retarded version of the raw alignment signal; and
  aligning the substrate or reticle based on the output alignment signal.

17. The method of claim 16, wherein the phase-advanced version includes an advancement of pi radians and the phase-retarded version includes a retardation of pi radians.

* * * * *